United States Patent [19]

Brannon

[11] Patent Number: 4,731,158

[45] Date of Patent: Mar. 15, 1988

[54] HIGH RATE LASER ETCHING TECHNIQUE

[75] Inventor: James H. Brannon, Hopewell Junction, N.Y.

[73] Assignee: International Business Machines Corporation, Armonk, N.Y.

[21] Appl. No.: 906,490

[22] Filed: Sep. 12, 1986

[51] Int. Cl.$^4$ .................. C23F 1/00; H01L 21/306
[52] U.S. Cl. .................. 156/643; 156/662; 156/345
[58] Field of Search .................. 156/643, 345, 662

[56] References Cited

U.S. PATENT DOCUMENTS

| | | | |
|---|---|---|---|
| 4,038,117 | 7/1977 | Noble | 156/646 |
| 4,361,461 | 11/1982 | Chang | 156/643 |
| 4,435,898 | 3/1984 | Gaur et al. | 156/643 |
| 4,505,949 | 3/1985 | Jelks | 427/38 |
| 4,535,531 | 8/1985 | Bhatia et al. | 156/643 |
| 4,546,536 | 10/1982 | Chang | 156/643 |
| 4,579,628 | 4/1986 | Suzuki | 156/626 |

OTHER PUBLICATIONS

Appl. Phys. Lett. 46(7), p. (654).
J. Chem. Phys. 74(2), 15 Jan. 1981.

Primary Examiner—Kenneth M. Schor
Assistant Examiner—Lori-Ann Cody
Attorney, Agent, or Firm—William T. Ellis

[57] ABSTRACT

A method and means for high-rate etching a material is disclosed including the steps of disposing a gas mixture of a fluorine-containing molecule and $H_2$ over the surface of a material to be etched; and laser dissociating this fluorine-containing molecule in the gas mixture to cause very fast etching of the material surface. In a preferred embodiment, the fluorine-containing molecule is chosen from the group of $NF_3$, $SF_6$, and $COF_2$, and the surface to be etched is unmasked silicon.

10 Claims, 1 Drawing Figure

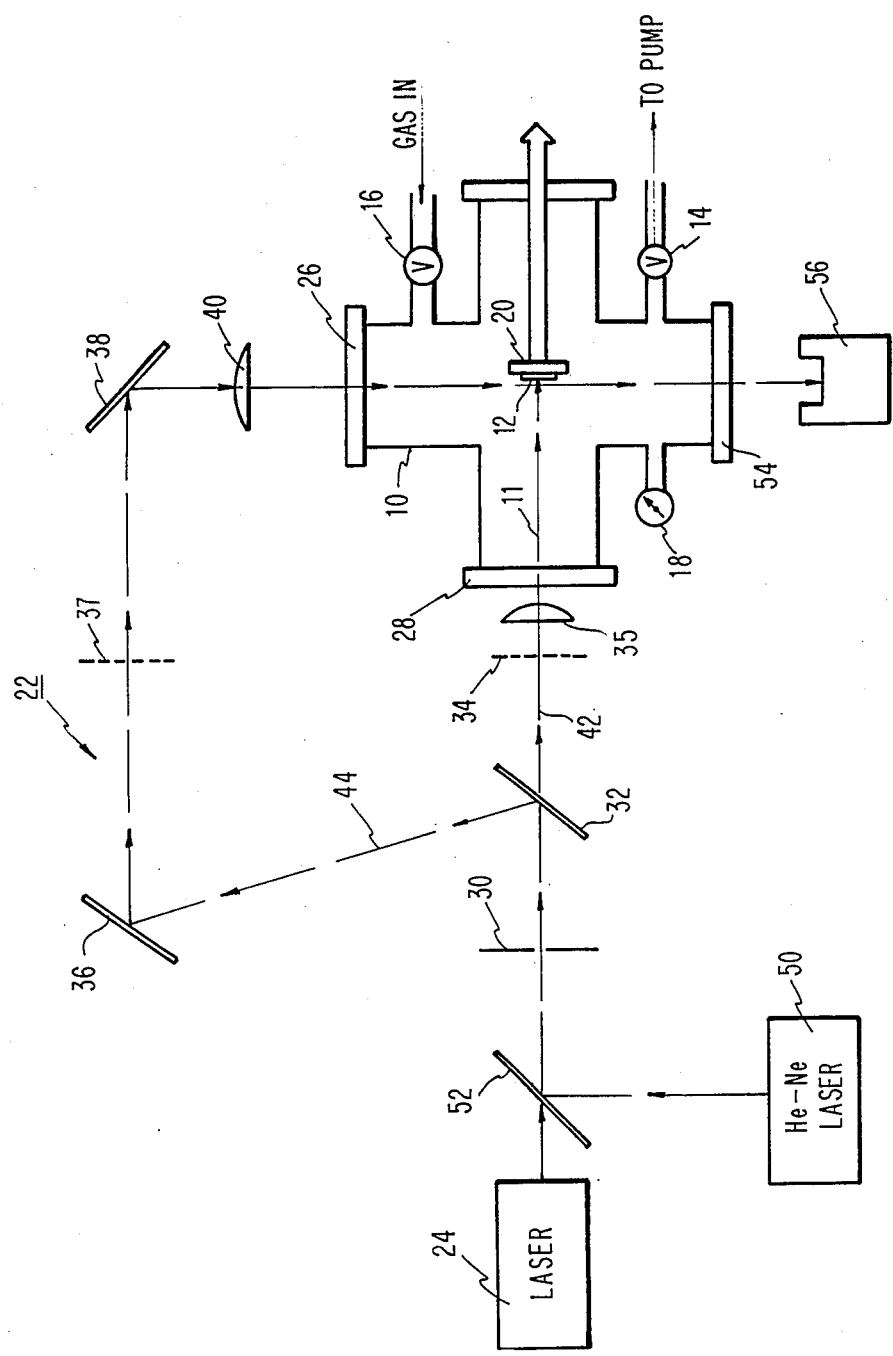

HIGH RATE LASER ETCHING TECHNIQUE

BACKGROUND OF THE INVENTION

The present invention relates generally to material etching, and more particularly to high-rate etching via energy beam dissociation.

Etching is a standard process step used in the fabrication of many of products, most notably semiconductor circuit products for the electronics industry. There are a variety of etching techniques based on the use of either wet chemical etch baths or dry etch plasmas as the etching medium. All of these techniques are characterized by the requirement to initially deposit a mask layer, typically a photoresist layer, over the surface to be etched to thereby define a surface pattern to be etched therein. Such a masking step typically requires the separate steps of depositing the mask layer, properly developing that layer, and after the etching step, removing the mask layer. It would be highly desirable to define the desired etch pattern during the etch step itself, and thereby eliminate the above-described masking steps. However, the etch-rate for such an etch process must be fast enough to provide a clear process advantage over current etch techniques.

In this regard, it is known that a surface may be etched by laser-induced dissociation of a molecule to form a radical etchant adjacent to the surface to be etched. For example, Loper and Tabat, Applied Physics Letters 46(7), Apr. 1, 1985, at page 675, disclose the use of an ArF laser to dissociate $COF_2$ to obtain fluorine radicals for etching silicon. Likewise, Chuang, Journal of Chemical Physics, 74(2), Jan. 15, 1981, at page 1453, discloses the use of a $CO_2$ laser to dissociate $SF_6$ to obtain fluorine radicals for etching silicon. Both of these references describe photo dissociation techniques for generating radical etchants from the interaction of radical precursor molecules with photons at or near a gas-substrate interface. The substrate at the interface undergoes an etching reaction with the radicals in the localized regions exposed to the laser light via the formation of volatile compounds containing the substrate elements. By controlling the localized areas exposed to laser light, it is possible to simultaneously pattern and etch the substrate with submicron resolution. However, radical etching via laser-induced dissociation is slow relative to currently available etching processes.

The invention as claimed is intended to eliminate most presently-required substrate masking steps while providing high-rate radical etching of a material via energy-beam dissociation.

SUMMARY OF THE INVENTION

Briefly, the present invention comprises a method for high-rate etching a semiconductor material, comprising the steps of:

disposing a gas mixture of a fluorine-containing molecule and $H_2$ over the surface of the semiconductor material to be etched, with the fluorine-containing molecule having at least one strong absorption line; and directing a beam of energy adjacent to the semiconductor material surface to be etched, with the energy beam having a wavelength which approximately matches the at least one strong absorption line of the fluorine-containing molecule, and having sufficient energy to cause the molecule to dissociate to initially form at least one fluorine atom per molecule to thereby cause very fast etching of the semiconductor surface.

In one embodiment of the present invention, the disposing step may comprise the step of disposing a gas mixture of $H_2$ and a fluorine-containing molecule from the group consisting of $NF_3$, $SF_6$, and $COF_2$ over the surface of the material to be etched.

In a most preferred embodiment of the present invention, the disposing step comprises the step of disposing a gas mixture of $NF_3$ and $H_2$ over the surface of a silicon material to be etched, with the pressure ratio $NF_3/H_2$ being in the range 2–14, and using a laser as the energy beam.

The present invention, in another aspect, comprises an apparatus for high-rate etching of a material, comprising:

a chamber for holding a surface of an item to be etched;

means for disposing a gas mixture of a fluorine-containing molecule and $H_2$ over the surface to be etched, with the fluorine-containing molecule having at least one strong absorption line; and means for directing an energy beam adjacent to the semiconductor surface, with the energy beam having an energy which matches said at least one strong absorption line to dissociate the fluorine-containing molecule to initially form at least one fluorine atom per molecule to cause high rate etching of the semiconductor surface.

BRIEF DESCRIPTION OF THE DRAWING

The FIGURE shows one embodiment of an apparatus which may be utilized to implement the present invention.

DETAILED DESCRIPTION OF THE PREFERRED EMBODIMENT

It has been discovered that photo dissociating a molecule to obtain a fluorine-atom radical in the presence of $H_2$ yields an extremely high etch rate on an adjacent semiconductor surface to be etched. This very high etch rate is surprising and unexpected in view of prior art teachings in the plasma-etching field that the addition of $H_2$ reduces the etch rate of fluorine radicals and is thus to be used as a scavenger gas. In this regard, see U.S. Pat. Nos. 4,579,623 and 4,505,949.

The method and apparatus of the present invention will now be described in the context of the device shown in the FIGURE. It should be noted that the device shown in the FIGURE was an experimental device utilized in making the present discoveries. The present invention is not limited in any fashion to this particular experimental device shown in the FIGURE.

Referring now to the FIGURE, there is shown a standard etching chamber 10 for holding a semiconductor wafer of material 12 to be etched. The wafer 12 is disposed with its surface to be etched centered about a center line 11. The chamber 10 includes a line 14 connected to a pump for creating a vacuum within the chamber. The chamber further includes a gas input line 16 providing a desired etching gas mixture into the chamber. The chamber 10 also includes a pressure gauge 18 and a pedestal 20 for holding the wafer 12 to be etched. The pedestal 20 is connected in the FIGURE to a quartz crystal micro balance for detecting changes in mass in the wafer 12. This micro balance operates by generating a frequency which is dependent upon the mass of the wafer 12 and measuring changes in this frequency to thereby measure the etch rate on the surface of the wafer 12.

Means 22 is provide in the FIGURE for dissociating one of the etching gas molecules contained in the chamber in adjacency to the surface of the wafer 12 to be etched. In the embodiment shown in the FIGURE, this dissociating means 22 may comprise means for directing a beam of energy at the surface of the wafer 12 to be etched, with the energy beam having an energy which approximately matches a strong absorption line of the molecule to be dissociated. In the experimental embodiment shown in the FIGURE, the means for directing a beam of energy comprises a laser 24 in combination with various optical components to direct the beam from the laser 24 through one or more laser beam transparent windows 26 or 28 in the chamber 10. In the embodiment shown in the FIGURE, the laser beam optics comprise an iris diaphragm 30, a beam splitter 32, a filter 34, a lense 35, mirrors 36 and 38, a filter 37, and a lense 40. This set of optical components is configured to direct the beam from the laser 24 so that a portion thereof is transmitted through the optical window 28 to impinge orthogonally on the surface of the wafer 12, and also to direct a portion of the laser beam through the optical window 26 in the chamber 10 to propagate adjacent to and parallel with the surface of the wafer 12.

In operation, the laser beam from the laser 24 is directed through the diaphragm 30 which operates to define the beam size. This defined laser beam is then directed through the beam splitter 32 which transmits a portion of the beam along the path 42, and reflects a portion of the beam along the path 44. The laser beam transmitted along the path 42 propagates through the filter 34 and the lense 35 and through the window 28 into the chamber 10. The filter 34 in path 42 is a power attenuator for controlling the power of the laser beam. The lense 35 is for focussing the laser beam to a point along the center line 11 for the wafer 12, with the focus point either at the wafer surface or in the adjacency thereto. Likewise, the portion of the laser beam reflected along the optical path 44 is reflected by the mirror 36, transmitted through the filter 37, reflected by the mirror 38, and focused by the lense 40 to propagate through the window 26 into the chamber 10. Again, the filter 37 is a power attenuator for controlling the power of the laser beam. The lense 40 is utilized to focus the laser beam at the center line 11 for the wafer 12.

The apparatus shown in the FIGURE further may conveniently include some means for aligning the laser beam in the system. In the embodiment shown, a small He-Ne laser 50 is directed along the same path as the beam from the laser 24 by means of a beam splitter 52. Alignment may be accomplished by utilizing this small laser 50 prior to turning on the dissociating laser 24. The apparatus in the FIGURE further includes a third window 54 and a power meter/beam stop 56 for measuring the beam power of the dissociating laser 24.

As noted previously, the present invention is based on the unexpected discovery that the energy-beam dissociation of a fluorine-containing molecule in the presence of $H_2$ adjacent to the surface of a semiconductor material to be etched causes an extremely fast etching of this material surface. Three examples are now provided for the present invention.

In the first example, an $NF_3$ and an $H_2$ gas mixture at room temperature was utilized to verify the present invention. In this experiment, the $NF_3$ (nitrogen trifluoride) gas pressure was varied over a series of runs from 25 Torr to 150 Torr, while the $H_2$ gas was varied from 5 Torr to 30 Torr. It was found that pressure ratios of $NF_3/H_2$ in the range 2-14 provided extremely high-rate etching of an underlying silicon material, when the $NF_3$ molecule was dissociated. This dissociation was achieved by utilizing a $CO_2$ laser within an energy range of 100 mj per pulse up to 600 mj per pulse. This laser generated a wavelength of 922 cm$^{-1}$ which matches a strong absorption line in $NF_3$. The focusing of the $CO_2$ laser beam was accomplished by a zinc selenide lense 40 with a focal length of 15 cm. In a preferred embodiment, 10 Torr of $H_2$ was utilized in combination with 70 Torr of $NF_3$ to provide a resulting pressure of 80 Torr. The monitoring of the etching of the silicon by means of the quartz crystal micro balance showed that one pulse from the $CO_2$ laser 24 resulted in an instantaneous etching, followed by a dark etching that continued for several minutes. The final etch rate was found to be in excess of 200 angstroms/cm$^2$/pulse. In contrast, using the $NF_3$ alone at 70 Torr and using the same laser conditions, an etch rate of only approximately 2 angstroms/cm$^2$/pulse was observed. Accordingly, it can be seen that adding the $H_2$ to the $NF_3$ unexpectedly resulted in an enhancement of over 2 orders of magnitude in the etch rate, relative to the $NF_3$ alone.

It is speculated that the above-described unexpected result was caused by the energy beam acting to promote a photo-induced chemical reaction between the $NF_3$ and the $H_2$ (or their reaction products) and the silicon that created conditions under which rapid etching of the silicon occurred. It is speculated that the $H_2$ or possibly HF acted to remove an oxide on the semiconductor surface to thereby promote the fast etching of the underlying silicon. It is also speculated that the complexity of standard plasma ion products tends to negate this effect in plasma etching devices.

It should be noted that the foregoing experiment with $NF_3$ is significant because $NF_3$ is a fairly inert gas which will not act upon a given substrate such as silicon unless photoactivated by a laser. The laser essentially breaks up the $NF_3$ molecule into its constituent parts including at least one fluorine atom, which is highly reactive. This relative inertness of the $NF_3$ molecule in combination with its very fast etching rate when dissociated in the presence of $H_2$ makes it a prime candidate for implementing a maskless etching process. The impingement of the laser beam on or adjacent to the surface of the wafer being etched could be used to define a predetermined etch pattern on the wafer surface without the use of a mask layer. Such a predetermined pattern could be defined on the surface of the wafer 12 simply by scanning the laser beam in a predetermined pattern, as is well known in the art. Alternatively, the laser beam could be directed along a stationary axis, and the wafer 12 translated by means of standard X-Y servomotors in a well known manner. A step and repeat pulsed laser process could be utilized with either pattern determining technique. It should also be noted that both laser beams, i.e., the beam directed parallel to the surface and the beam directed perpendicular to the surface of the wafer 12 could be utilized simultaneously to obtain a desired etching rate.

It should be noted that $NF_3$ is advantageous for maskless etching because it is a relatively small molecule whose dissociated components will not cause undesirable secondary reactions which could, for example, deposit some form of a polymer on the surface being etched. Finally, it should be noted that $NF_3$ is advantageous because it can be dissociated with long wavelengths.

It should be noted that there are a number of other strongly absorbing lines in the $NF_3$ molecule which may be utilized for dissociation. For example, an excimer UV laser could be utilized to dissociate the $NF_3$ molecule.

As a further example of the present invention, the laser dissociation of $SF_6$ in the presence of $H_2$ could be utilized to obtain the desirable high-rate etching of a substrate such as silicon. In this example, a pressure of 1–50 Torr of $SF_6$ may be utilized with a sufficient pressure of $H_2$ to realize a $SF_6/H_2$ pressure ratio range of 1–10. The dissociation of the $SF_6$ molecule may be obtained by means of a $CO_2$ infrared laser at a wavelength of 10.6 microns and with a pulse energy in the range 100–600 mj per pulse.

As a third example, $COF_2$ may be energy-beam dissociated in the presence of $H_2$ to obtain high-rate etching of a material. In this example, a $COF_2$ pressure of 50–500 Torr may be utilized in combination with 50 Torr of $H_2$ in order to implement a $COF_2/H_2$ ratio range of 1–10. $COF_2$ could be dissociated by means of an argon fluoride UV laser tuned to 0.193 microns and using a power of 50–100 mj per pulse.

The above-described invention discloses a method and means for obtaining an extremely high etch rate by energy-beam dissociating a fluorine-containing molecule in the presence of $H_2$. This invention thus makes feasible maskless etching of a surface, thereby eliminating the standard mask formation and mask removal steps.

While the present invention has been particularly shown and described with reference to preferred embodiments therefor, it will be understood by those skilled in the art that the foregoing and other changes in form and detail may be made therein without departing from the spirit and scope of the present invention.

I claim:
1. A method for increasing the rate of laser dissociative etching on a material in a semiconductor chip, comprising the steps of:
  etching by disposing a gas mixture of a fluorine-containing molecules and $H_2$ present in an amount sufficient to increase the lasar dissociative etch rate over that rate which would exist in the absence of $H_2$, over the surface of said material in a semiconductor chip to be etched, wherein said fluorine-containing molecule has at least one strong absorption line; and
  directing a laser beam of energy adjacent to said material surface to be etched, with said laser energy beam having a frequency which approximately matches said at least one strong absorption line of said fluorine-containing molecule, and having sufficient energy to cause said molecule to dissociate to initially form at least one fluorine atom per molecule, to thereby cause said dissociation and cause very fast etching of said material surface.

2. A method as defined in claim 1, wherein said molecule dissociating step comprises the step of dissociating said molecule over a material surface which has no mask layer therein.

3. A method as defined in claim 1, wherein said disposing step comprises the step of disposing a gas mixture of $H_2$ and a fluorine containing molecule from the group consisting of $NF_3$, $SF_6$, and $COF_2$ over the surface of said material to be etched.

4. A method as defined in claim 3, wherein the fluorine-containing molecule/$H_2$ pressure ratio is in the range 2 to 14.

5. A method as defined in claim 4 wherein said directed laser beam has an energy in the range of 100 mJ per pulse to 600 mJ per pulse.

6. A method as defined in claim 1, wherein said disposing step comprises the step of disposing a gas mixture of $NF_3$ and $H_2$ over the surface of said material to be etched.

7. A method as defined in claim 6, wherein said disposing step comprises the step of disposing said gas mixture of $NF_3$ and $H_2$ over the surface of said material in an $NF_3/H_2$ pressure ratio in the range 2 to 14.

8. A method as defined in claim 7, wherein said material to be etched is silicon.

9. A method as defined in claim 1, wherein said material to be etched is silicon.

10. A method for high-rate etching a silicon surface comprising the steps of:
  disposing a gas mixture of $NF_3$ and $H_2$ with an $NF_3/H_2$ pressure ratio in the range 2–14 over an unmasked surface of silicon to be etched;
  directing a laser beam adjacent to said silicon surface to be etched, said energy beam having a wavelength which approximately matches a strong absorption line of said $NF_3$ and having sufficient energy to cause said $NF_3$ to dissociate to initially form at least one fluorine atom per molecule to thereby cause said dissociation and cause high-rate etching of said silicon surface.

* * * * *